US010033838B2

(12) United States Patent
Parkin

(10) Patent No.: US 10,033,838 B2
(45) Date of Patent: *Jul. 24, 2018

(54) METHOD AND APPARATUS FOR CONVERSION BETWEEN LOGICAL AND PHYSICAL FRAMES FOR A SERIAL LINK APPLICATION

(71) Applicant: Oracle International Corporation, Redwood City, CA (US)

(72) Inventor: Michael W. Parkin, Palo Alto, CA (US)

(73) Assignee: Oracle International Corporation, Redwood Shores, CA (US)

( * ) Notice: Subject to any disclaimer, the term of this patent is extended or adjusted under 35 U.S.C. 154(b) by 161 days.

This patent is subject to a terminal disclaimer.

(21) Appl. No.: 14/872,716

(22) Filed: Oct. 1, 2015

(65) Prior Publication Data
US 2017/0099369 A1    Apr. 6, 2017

(51) Int. Cl.
*H04L 29/06* (2006.01)
*H04L 12/24* (2006.01)
*H04L 1/00* (2006.01)
*H04L 29/14* (2006.01)
*H03M 9/00* (2006.01)

(52) U.S. Cl.
CPC ............. *H04L 69/08* (2013.01); *H03M 9/00* (2013.01); *H04L 1/0061* (2013.01); *H04L 69/40* (2013.01)

(58) Field of Classification Search
None
See application file for complete search history.

(56) References Cited

U.S. PATENT DOCUMENTS

| 7,324,541 B2 * | 1/2008 | Muthukrishnan | H04L 49/254 370/429 |
|---|---|---|---|
| 7,899,004 B2 | 3/2011 | Ulupinar | |
| 8,243,745 B2 | 8/2012 | Endo | |
| 8,824,560 B2 | 9/2014 | Bakke | |
| 2002/0118692 A1 * | 8/2002 | Oberman | H04L 12/5601 370/419 |

* cited by examiner

*Primary Examiner* — Candal Elpenord
(74) *Attorney, Agent, or Firm* — Meyertons, Hood, Kivlin, Kowert & Goetzel, P.C.

(57) ABSTRACT

A method and apparatus for logical-physical frame conversion in a serial link application is disclosed. An integrated circuit (IC) includes a serializer-deserializer (SERDES) coupled to a communications link and configured to convert outgoing data transmissions from parallel to serial and convert incoming data transmissions from serial to parallel. A framing unit is coupled to the SERDES and configured to convert data between a logical frame format for parallel transfer and a physical frame format for serial transfer over the communications link. The logical frame has a first number of bytes and the physical frame has a second number of bytes less than or equal to the first number. The first number is variable and the second number is fixed. The framing unit is further configured to convert data between the logical frame format and the physical frame format when the first number is a non-integral power of two.

20 Claims, 9 Drawing Sheets

METHOD AND APPARATUS FOR CONVERSION BETWEEN LOGICAL AND PHYSICAL FRAMES FOR A SERIAL LINK APPLICATION

BACKGROUND

1. Technical Field

This disclosure relates to electronic systems, and more particularly, to communications links involving various frame sizes used for communications between different agents of an electronic system.

2. Description of the Related Art

In computers and other electronic systems, a significant amount of communications between the various agents thereof occurs during normal operation. Such communications may include chip-to-chip communications as well as intra-chip communications between functional units implemented thereon.

Some communications may be conducted in parallel, i.e. by concurrently transmitting a number of bits in a unit of information. Other communications may be conducted serially, i.e., transmitting bits consecutively in a predetermined order. In some cases, chip-to-chip communications may be conducted serially over high-speed differential communications links, even though the information on-chip is transferred in parallel. The chips on each side of the serial communications link may include respective functional circuitry known as a serializer-deserializer (SERDES). The transmitting chip may convert the parallel data into serial data, while the receiving chip may convert the received serial data back into parallel data. When serially transmitted, the data may be transferred in a frame of a specified size. The frame size may differ from the frame size of the data when transferred in parallel on-chip. Accordingly, each SERDES may include circuitry to convert the data between a serial frame size, for transmission over the serial link, and a parallel frame size, for transmission on-chip.

SUMMARY OF THE DISCLOSURE

A method and apparatus for logical-physical frame conversion in a serial link application is disclosed. In one embodiment, an integrated circuit (IC) includes a serializer-deserializer (SERDES) coupled to a communications link and configured to convert outgoing data transmissions from parallel to serial and convert incoming data transmissions from serial to parallel. The IC further includes a framing unit coupled to the SERDES and configured to convert data between a logical frame format for parallel transfer and a physical frame format for serial transfer over the communications link. The logical frame has a first number of bytes and the physical frame has a second number of bytes that is less than or equal to the first number, with the first number being variable and the second number being fixed. The framing unit is further configured to convert data between the logical frame format and the physical frame format when the first number is a non-integral power of two.

In one embodiment, a method includes converting, using a framing circuit, data between a logical frame format for parallel transfer and a physical frame format to be serialized for serial data transfer over a serial communications link. The logical frame has a first number of bytes and a physical frame has a second number of bytes that is less than or equal to the first number of bytes, the first number being variable and the second number being fixed. At least one possible value of the first number is a non-integral power of two. The method further includes serializing a first physical frame, using a serializer-deserializer (SERDES) for transmission over the serial communications link, and de-serializing a second physical frame, using the SERDES, received over the serial communications link.

BRIEF DESCRIPTION OF THE DRAWINGS

Other aspects of the disclosure will become apparent upon reading the following detailed description and upon reference to the accompanying which are now described as follows.

Figure 1:
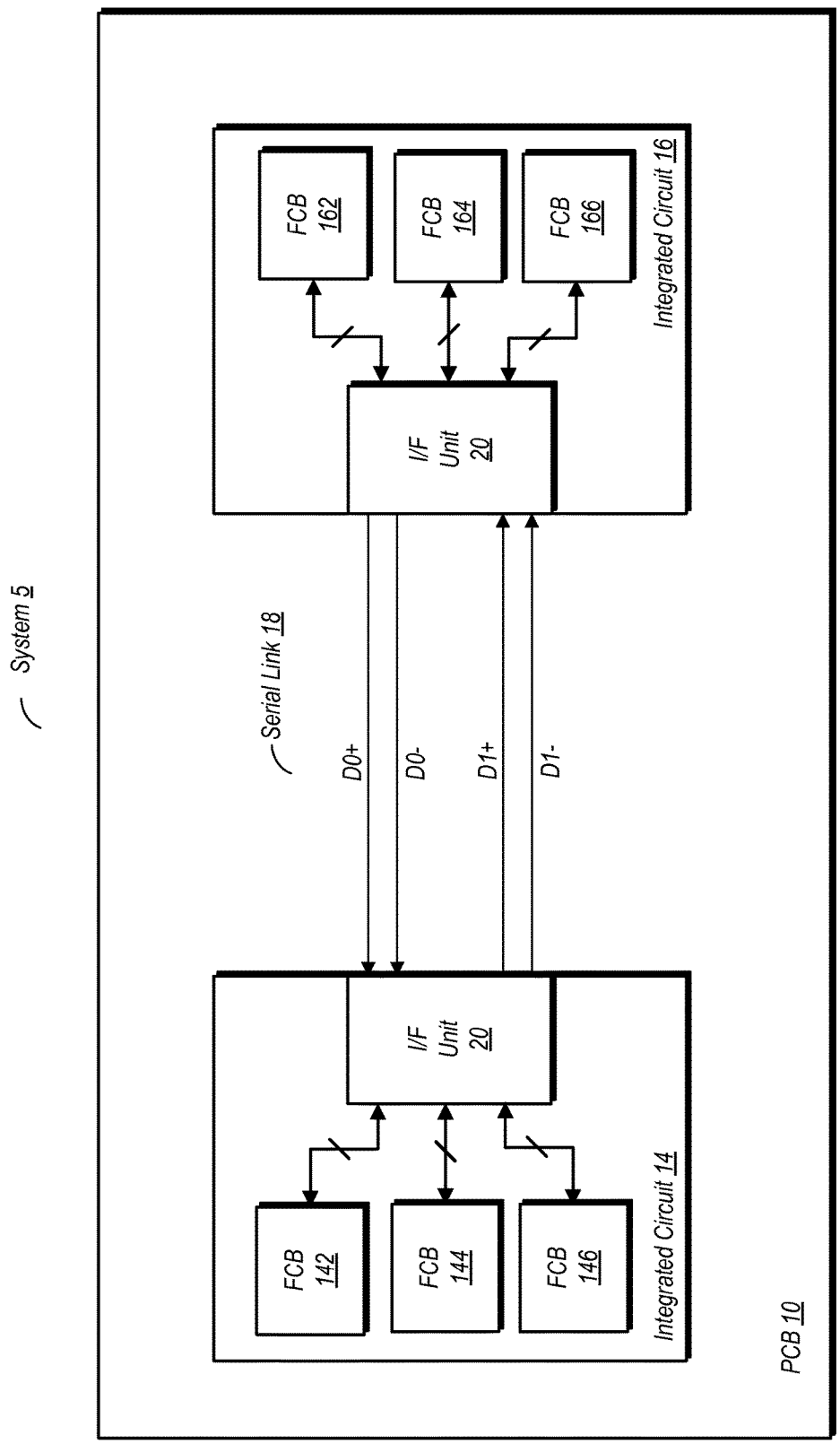
FIG. 1 is a block diagram of one embodiment of an electronic system including a pair of integrated circuits (ICs) coupled to one another by a serial communications link.

While the subject matter disclosed herein is susceptible to various modifications and alternative forms, specific embodiments thereof are shown by way of example in the drawings and will herein be described in detail. It should be understood, however, that the drawings and description thereto are not intended to be limiting to the particular form disclosed, but, on the contrary, is to cover all modifications, equivalents, and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) (or pre-AIA paragraph six) interpretation for that unit/circuit/component.

DETAILED DESCRIPTION

Turning now to FIG. 1, a block diagram of one embodiment of an exemplary system is shown. System 5 as shown here is an exemplary system presented for illustrative purposes, but is not intended to be limiting. It is further noted that while the system shown here includes multiple integrated circuits (ICs) mounted on a printed circuit board (PCB), the disclosure may also be applicable to a single IC, such as system on a chip (SoC) in which at least some functional units communicate with others over serial links similar to those discussed below.

In the embodiment shown, system 5 includes PCB 10 upon which two IC 14 and IC 16 are both mounted. IC 14 includes a number of functional circuit blocks (FCBs) including FCB 142, FCB 144, and FCB 146. Similarly, IC 16 includes FCB 162, FCB 164, and FCB 166. Each of the FCBs may perform various functions and include various types of circuitry. For example, FCBs on IC 14 and IC 16 may include processor cores and/or components thereof, graphics processors, interface circuitry, cache controllers, and so forth. In general, the FCBs may implement virtually any type of functional circuitry that may be placed on an IC.

IC 14 and IC 16 are coupled to one another by a serial communications link 18 (hereinafter 'serial link 18'). Serial link 18 actually includes two unidirectional serial links, each of which is implemented using differential signaling. D0 (which includes D0+ and D0−) is a differential signal link for conveying data from IC 16 to IC 14. D1 (which includes D1+ and D1−) is a differential signal link for conveying date from IC 14 to IC 16.

Both IC 14 and IC 16 include a respective interface unit 20. The FCBs in each of the ICs may be coupled to the interface unit 20 in their respective IC. Transfer of data conducted between an interface unit 20 and an FCB within a given IC may be performed in parallel, i.e. a parallel transfer of data. However, as shown in the drawing, transfer of data between IC 14 and IC 16, and particularly between the interface units 20 of each, may be conducted in serial. Accordingly, each of the interface units 20 may include circuitry for converting data between parallel and serial formats. Additionally, as will be discussed below, logic for framing the data and converting between logical and physical frames may also be included in each interface unit 20. Arbitration circuitry for forming frames of data using packets received from each of the FCBs may also be included.

Figure 2:
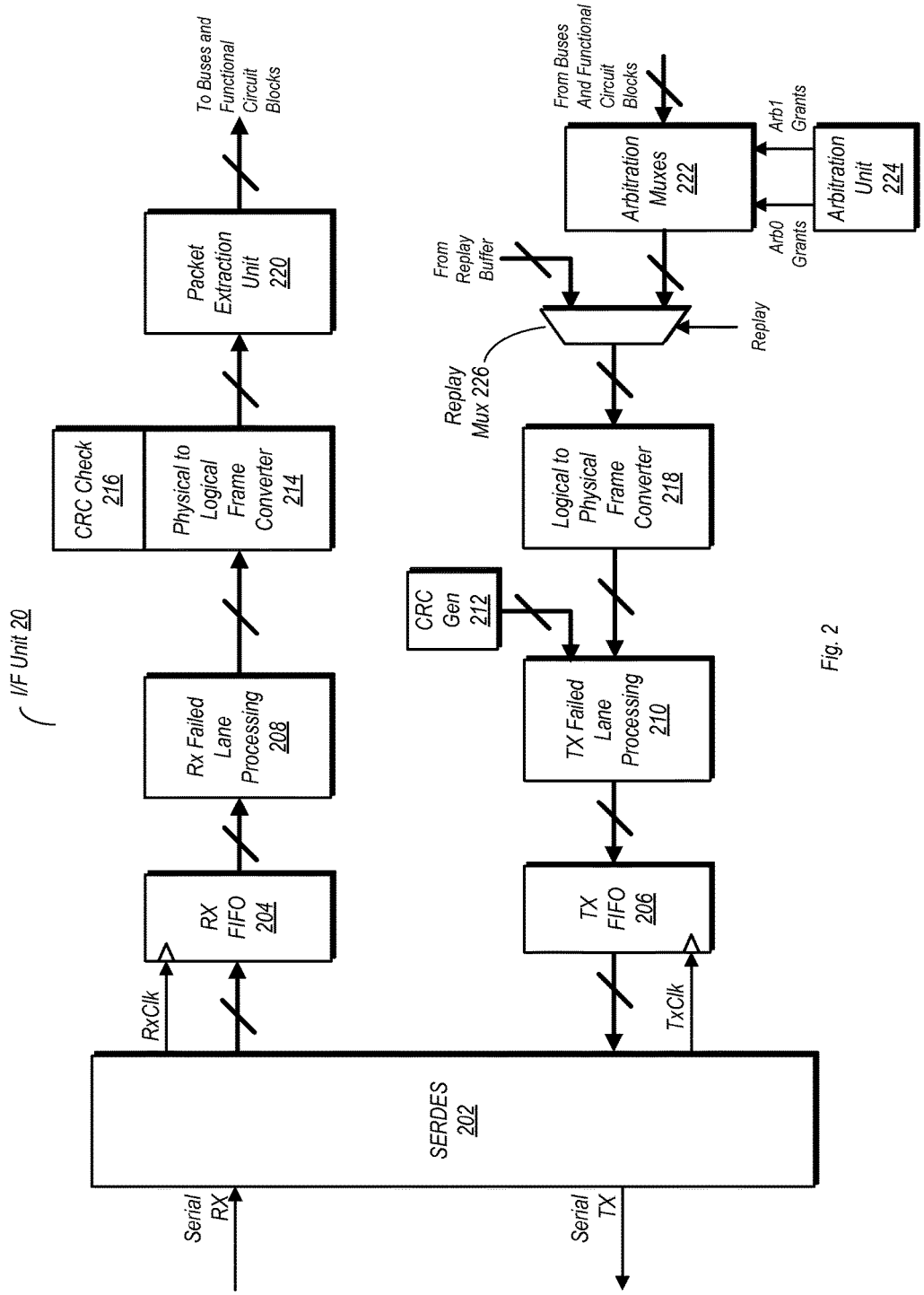
FIG. 2 is a block diagram of one embodiment of an interface circuit.

FIG. 2 is a block diagram of one embodiment of an interface unit 20. In the embodiment shown, interface unit 20 includes circuitry for processing outgoing transactions to be transferred serially as well as circuitry for processing incoming transactions received serially. Data may be received from the variously coupled functional circuit blocks (not shown in this drawing) in parallel, as packets. The packets may be concatenated to form logical frames that may then be converted to physical frames. The physical frames may then be converted from a parallel format to a serial format for transmission over a serial link. Interface unit 20 in the embodiment shown includes a serializer-deserializer 202, which is configured to convert outgoing transactions from a parallel format to a serial format. Upon conversion from parallel to serial, data may be transmitted over the serial link labeled here as 'serial TX' (which may be a differential link as shown in FIG. 1). Incoming transactions may be received via the serial link labeled here as 'serial RX'. Upon being received, SERDES 202 may then convert the received data into a physical frame in a parallel format.

Data received for an outgoing transaction may be initially received by interface unit 20 at arbitration multiplexers 222. The data may be received in various sized packets from correspondingly coupled functional circuit blocks in the IC, each of which may be coupled to arbitration circuit 222 by correspondingly sized buses. For example, a first packet may be 4 bytes wide, while a second packet may be 8 bytes wide, and a third packet may be 12 bytes wide. The arbitration multiplexers 222 comprise selection circuitry that is coupled to select the variously received packets, as well as concatenation circuitry configured to concatenate the packets together to form a logical frame.

The selection of packets may be performed by arbitration unit 224. In the embodiment shown, arbitration unit 224 may include circuitry configured to implement an arbitration scheme. For example, one embodiment of arbitration unit 224 may include circuitry for implementing a round robin arbitration scheme. However, embodiments of an arbitration unit 224 that implement other arbitration schemes are possible and contemplated. Furthermore, embodiments of arbitration unit 224 capable of implementing multiple arbitration schemes that are selectable as desired are also possible and contemplated.

The arbitration circuit discussed above may work on segments. A segment as defined herein may be common denominator of the various packet sizes received thereby. In one embodiment, a segment may be defined as the greatest common denominator of all possible sizes of the received packets. For example, if packets are received in sizes of 8 bytes, 16 bytes, and 32 bytes, the segment size is 8 bytes, since 8 is the greatest common denominator of these numbers. In another example, if packets are received in sizes of 8 bytes, 12 bytes, 16 bytes, and 20 bytes, the greatest common denominator is 4, and thus 4 is also the segment size. Each logical frame may be an integer multiple of the segment size. For example, if the segment size is 4, each logical frame may be, e.g., 4 bytes, 8 bytes, 12 bytes, 16 bytes, 20 bytes, and so forth. However, as noted, the logical frames generated in this embodiment may be at least the size of the physical frame size. Thus, if the physical frame size is 14 bytes, the minimum size of a logical frame in this embodiment is 16 bytes for an embodiment in which the segment size is 4. Basing logical frames on a segment size may greatly simplify the design of the arbitration circuitry and framing logic, which, as will be explained below, can be implemented using systems of one or more multiplexers.

The packets that are selected and concatenated by the arbitration circuitry discussed above form a logical frame. The logical frame may initially be received by a replay multiplexer 226, and may also be forwarded to a replay buffer (not shown). Should a transmission fail for some reason, replay multiplexer 226 may select the logical frame from the replay buffer for conversion and re-transmission. Otherwise, the logical frame received from the arbitration circuitry may be selected by replay multiplexer 226.

The logical frame selected by replay multiplexer 226 may be received by logical to physical frame converter 218 (hereinafter 'L2P 218'). L2P 218 may convert the logical frame into a physical frame for subsequent processing, including conversion to serial and subsequent transmission. In the embodiment shown, the logical frame may be, in terms of data size, at least as large as the physical frame. In many cases, the logical frame is larger than the physical frame. In one example, a logical frame may include 20 bytes of data, while a physical frame may be 14 bytes of data. Moreover, the conversion from logical frame size to physical frame size can accommodate various logical frame sizes using the same arbiter and framing logic of L2P 218. For example, L2P 218 in the embodiment shown may form a physical frame of 14 bytes based on received logical frames of 22 bytes, 20 bytes, 16 bytes, and so forth. Accordingly, while the physical frame size may be fixed, the logical frame size may be variable. The ability to convert multiple logical frame sizes into a physical frame may also enable the circuitry to accommodate failed lanes in the conversion process.

Furthermore, some embodiments may enable the conversion of logical frame sizes in which the number of bytes is a non-integer value. For example, one embodiment is contemplated in which a logical frame having 21.5 bytes can be converted to a physical frame. Some extra circuitry may be required in implementations that support logical frame sizes having a non-integer number of bytes. Using the 21.5 byte logical frame example, an extra buffer that stores nibbles (4 bits, or one half byte) may be provided in addition to a remainder buffer. The conversion circuitry may include circuitry to receive full bytes from the extra buffer, e.g., one for every two logical frames received.

When the logical frame size is greater than the physical frame size, L2P 218, the conversion of logical frames to physical frames may accommodate various combinations of failed lanes. A lane may be defined herein as a data signal path configured to convey data of a certain size. A lane may also implement a parallel data path. For example, one embodiment of a lane may be configured to convey two bytes of data, in parallel. Thus, a 20 byte logical frame may include 10 lanes in such an embodiment. This may also lessen the reduction in payload size when a lane fails. In prior art embodiments, a failed lane would result in a power of two reduction in the payload size. For example, if a lane failure occurs in a typical prior art embodiment, the payload size may be reduced by a power of two (e.g., from 8 lanes to 4 lanes responsive to the failure of any one of 8). In contrast, in the various embodiments discussed herein, the reduction in payload size may occur in non-integral powers of two. For example, in an 8 lane embodiment in accordance with this disclosure, a failure in any one lane may result in a payload reduction to 7 lanes, with the latter not being an integral power of two. In general, embodiments are possible and contemplated wherein the payload may be reduced only by the amount of data in the failed lane.

Generally speaking, L2P 218 may perform logical to physical frame conversion in which the number of bytes and the number of lanes are non-integral powers of two for both the logical and physical frames. This may in turn result in significantly greater flexibility, and may be enabled at least in part by using logical frames that are larger than the physical frames.

Since a logical frame in the embodiment shown may be larger than a physical frame, not all bytes of a received logical frame are used in a physical frame resulting from a conversion. Instead, as is discussed further below, a remainder may be saved and stored in a remainder buffer and used in the formation of a subsequent physical frame.

When converting from a logical frame to a physical frame the remainder is saved and the remainder size is incremented by the number of excess bytes. During the formation of a subsequent physical frame, a saved remainder from a previous cycle may be concatenated to a logical frame prior to the subsequent conversion to a next physical frame. If the number of bytes stored in the remainder buffer is equal to or greater than the physical frame size, the pipeline (including the arbitration circuitry of arbitrations multiplexers 222 and arbitration unit 224) may be stalled, and the next physical frame may be formed entirely from bytes of data stored in the remainder buffer. A state machine that tracks the amount remainder size stored in the remainder buffer may decrement the remainder size by the amount of data taken from the remainder buffer used to form the physical frame.

Processing of failed lanes may be performed transmit failed lane processing circuit 210 (hereinafter 'TXFLP 210'). A cyclic redundancy check (CRC) circuit 212 may generate a CRC code that is used to check for erroneous data when the physical frame is received. The CRC code may be transmitted with the physical frame.

The physical frame output by TXFLP 210 may be received by transmit first-in, first-out memory ('TX FIFO') 206. TX FIFO 201 may provide temporary storage for physical frames that are to be transmitted over the outgoing serial link. Furthermore, TX FIFO 201 may provide some elasticity to the transmission rates in order to not overload the receiver on the other side of the link. Physical frames may be output from TX FIFO 206 to SERDES 202 in accordance with a transmit clock ('TxClk') received by the former from the latter. Upon receiving a physical frame, SERDES 202 may convert it from a parallel format to a serial format and then perform the transmission over a serial link.

Incoming transmissions received by SERDES 202 may be converted from a serial format into a parallel format having a size equal to the physical frame size. Each physical frame may be transmitted to receive FIFO ('RX FIFO') 204 in accordance with the receive clock ('RxClk') conveyed from SERDES 202. RX FIFO 204 may provide temporary storage for incoming physical frames. The physical frames may then be conveyed to Rx Failed Lane Processing circuit (RXFLP) 208, which may determine which lanes have been marked as failing. Subsequently, physical frames may be conveyed to physical to logical frame converter (P2L) 214, which may perform the conversion back to logical frames. This conversion may include performing a CRC check by CRC check circuit 216 using the CRC code that accompanies the physical frame.

Since the physical frames may be smaller in size than the logical frames, the formation of the latter may thus require more than one of the former. Accordingly, P2L 214 in the embodiment shown includes a buffer coupled to receive the incoming physical frame. A state machine (discussed below) in P2L 214 may monitor the amount of data stored in the buffer. If the amount of data stored in the buffer is equal to or greater than the size of a logical frame, P2L 214 may consume at least some of this data to form a logical frame. In general, the determination of the amount of data stored in the buffer may be performed after each instance that a physical frame has been received. A logical frame may be formed each time the amount of data stored in the buffer is determined to be equal to or greater than the logical frame size. Formation of the logical frame by P2L 214 may be performed based on packets and the segment size, as with the initial formation of logical frames by the arbitration circuitry discussed above.

The logical frame output by the P2L 214 may then be forwarded to packet extraction unit 220. The packet extraction unit 220 may include circuitry configured to read the various packets present in a received logical frame, extract them, and forward them to their ultimate destination, typically another functional circuit block within the respective IC. Accordingly, packet extraction unit 220 may be coupled to multiple buses or interconnection circuitry that in turn is coupled to other functional circuit blocks.

Figure 3:
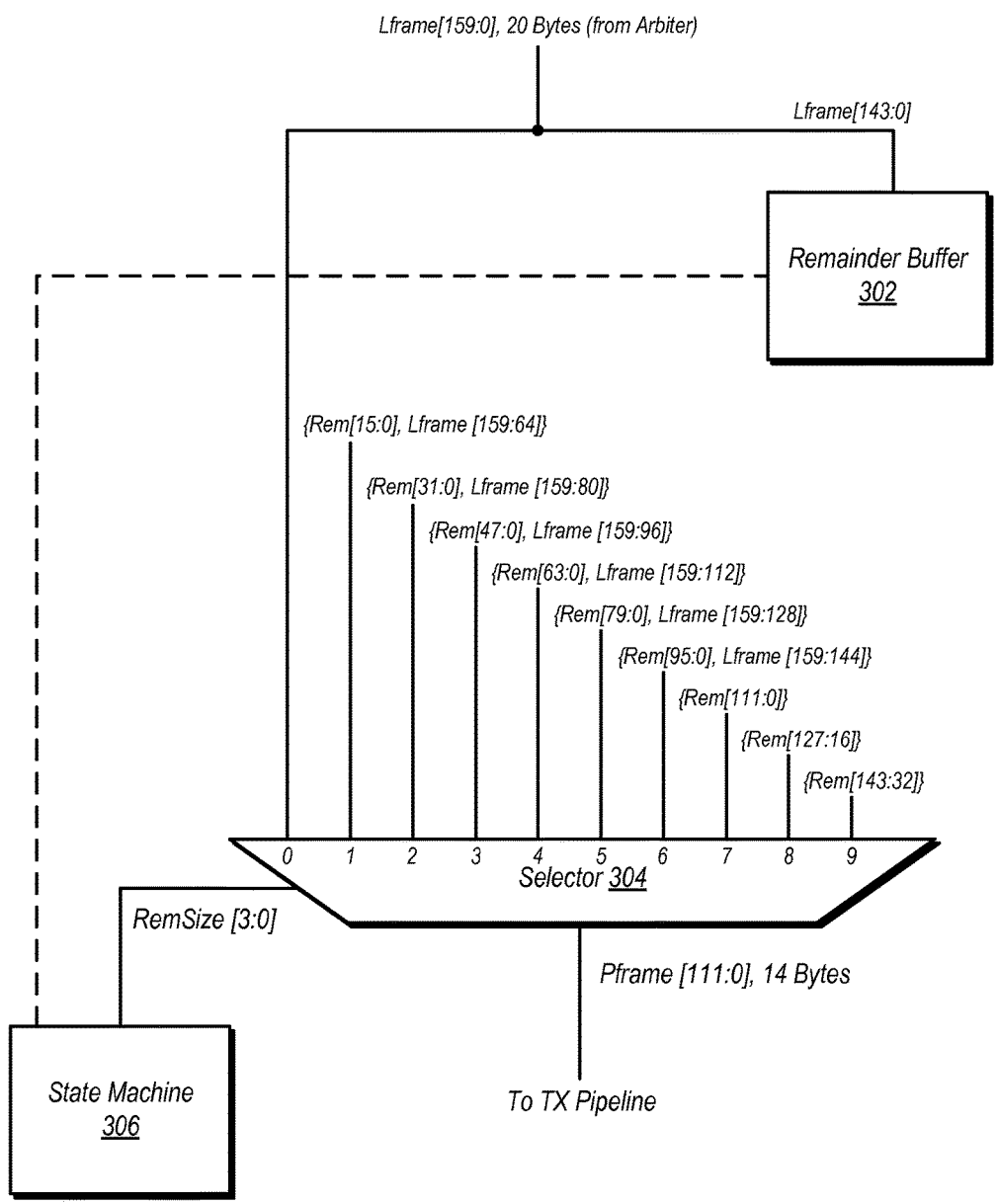
FIG. 3 is a diagram of one embodiment of circuitry in the framing unit for converting logical frames to physical frames.

Turning now to FIG. 3, a diagram illustrating one embodiment of circuitry in the framing unit for converting logical frames to physical frames. In this particular example, L2P 218 includes circuitry for converting an incoming 20 byte logical frame into a 14 byte physical frame. However, L2P 218 as shown here could also be configured to convert smaller logical frames, e.g., 16 bytes, into 14 byte logical frames. Moreover, the circuitry shown here may be scalable, both upward and downward, to accommodate different frame sizes, both logical and physical.

In the embodiment shown, L2P 218 includes a remainder buffer 302, a selector 304, and a state machine 306. The remainder buffer 302 is a memory that provides temporary storage for portions of a logical frame (i.e., a remainder) that are not converted into a physical frame on the immediate cycle. The amount of data of each logical frame that is saved as the remainder in remainder buffer 302 may vary from one cycle to the next.

State machine 306 includes circuitry that may control and determine which portions of an incoming logical frame are converted on the immediate cycle, as well as that which gets saved as the remainder. This includes determining not only the amount of data saved as the remainder, but the specific portions of the incoming logical frame that are saved. State machine 306 also includes circuitry configured to monitor/track the amount of data stored in remainder buffer 302. If state machine 306 determines that the amount of data stored in remainder buffer 302 is equal to or greater than the physical frame size (e.g., 14 bytes in this particular example), the next physical frame may be formed exclusively from data stored in the buffer. If state machine 306 determines that the amount of data stored in remainder buffer 302 is greater than zero but less than the physical frame size, the physical frame may be formed by using a portion of the incoming logical frame and a portion of the data stored in the buffer. In such an instance, the unused portion of the logical frame may be saved in remainder buffer 302 and used in a subsequently formed physical frame. If state machine 306 determines that remainder buffer 302 is completely empty, the next physical frame may be formed from a portion of the incoming logical frame, with the remainder being stored in remainder buffer 302.

State machine 306 also includes circuitry to control which portions of the incoming logical frame and data in the remainder buffer are selected for the physical frame. In particular, state machine 306 may generate selection signals RemSize [3:0] that are provided to selector 304. In the embodiment shown, selector 304 includes multiplexer circuitry and is configured to select data to be passed to form the physical frame. The physical frame may be formed based on the selection indicated by the selection signals generated by state machine 306. For example, if the selection signals cause the selection of position number 4, bits 63:0 of the remainder buffer and bites 159:112 of the incoming logical frame are selected to form the 14 byte (112 bit) physical frame. When the amount of date in the remainder buffer 302 is equal to or greater than the physical frame size, state machine 306 may cause one of positions 7, 8, or 9 to be selected, and thus the physical frame may be formed entirely from data stored in the remainder buffer. If the remainder buffer is completely empty, the state machine 306 may generate selection signals to cause position 0 to be selected, and thus the resulting physical frame is formed in its entirety from a portion of the incoming logical frame (with the unused portion being stored in remainder buffer 302).

Figure 4A:
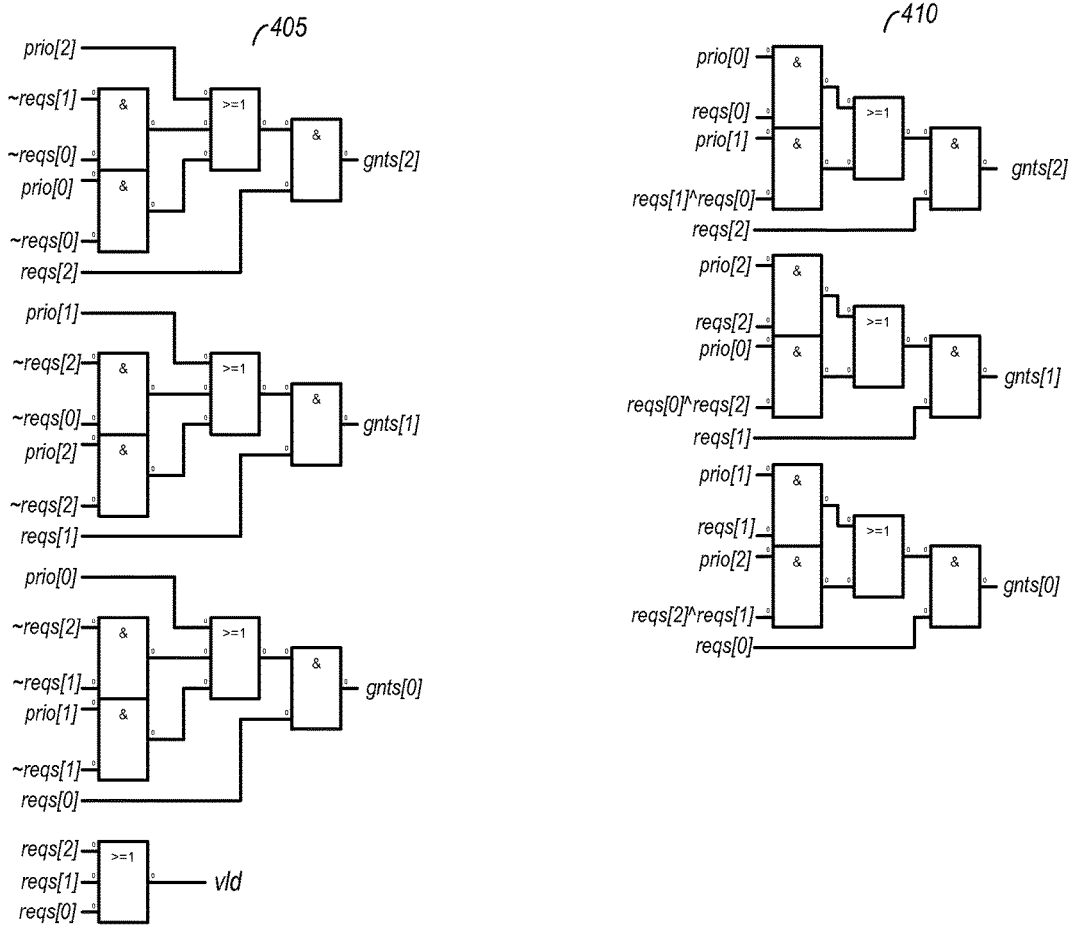
FIGS. 4A and 4B are diagrams illustrating one embodiment of an arbiter circuit for selecting packets in to form a logical frame.
Figure 4B:
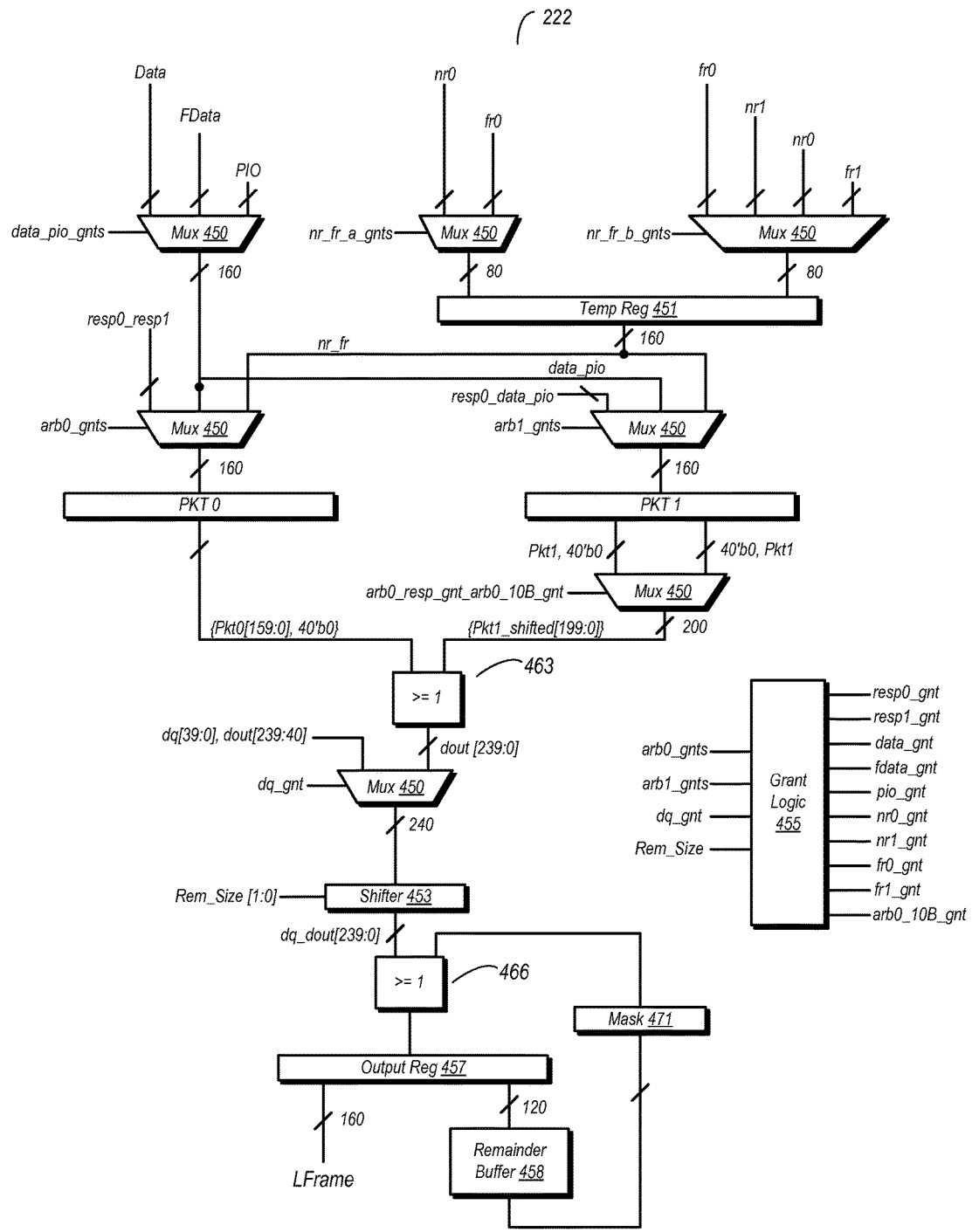

FIGS. 4A and 4B illustrate various aspects of arbitration circuitry, shown as arbitration unit 224 and arbitration multiplexer 222 in FIG. 2. The arbitration circuitry may select packets using an arbitration scheme, such as a round robin arbitration scheme in one embodiment. The packets may be received from the various functional circuit blocks of the IC, and may be received by channels referred to as virtual channels. Arbitration unit 224 may issue grants to packets received via various ones of the virtual channels based on priority. For example, one embodiment may issue grants for two to three highest priority virtual channels. In some embodiments, multiple packets may be accepted from the same virtual channel.

In FIG. 4A, two three-input arbiters are shown. Arbiter 405 in the embodiment shown implements logic circuitry for generating the arb0 grants (provided to arbitration multiplexer 222), and is configured to select the highest priority packet in accordance with the illustrated logic functions. Arbiter 410 in the embodiment shown implements logic circuitry for generating the arb1 grants, and is configured to select the next highest priority packet in accordance with the illustrated logic functions. It is noted that arbiter 410 is configured in such a manner to avoid selecting the same packet that was selected by arbiter 405. A third packet can also be selected in some embodiments if space is available in the logical frame without the need for a third arbiter.

Each of arbiters 405 and 410 in the embodiment shown is a three-input arbiter configured to receive priority signals (e.g., prio[0], prio[1], etc.), along with various request signals and their respective complements (e.g., req[0] and ~req[0]). Based on these signals and the illustrated logic functions, arbiter 405 generates a series of signals that are provided to arbitration multiplexers 222 in order to select the first packet ('pkt0'). Similarly, based on the received signals, arbiter 410 generates a series of signals to select the second packet (pkt1'), which are also conveyed to the arbitration multiplexers 222. Additionally, arbiter 405 in the embodiment shown is also configured to generate a valid signal ('vld') to enable second or third packets within a virtual channel to be selected. The input signals provided to arbiters 405 and 410 may be generated and provided by the various functional units.

FIG. 4B illustrates one embodiment of arbitration multiplexers 222. In this particular embodiment, a logical frames of up to 20 bytes may be converted into physical frames of 14 bytes. It is noted however that embodiments capable of performing conversions for logical and physical frames of different sizes are also possible and contemplated. For this particular example, the segment size is five, although this value is also exemplary and does not apply to all possible embodiments.

In the embodiment shown, arbitration multiplexers are configured to receive information of a number of different types. These types include data, forwarded data ('Fdata'), programmed I/O ('PIO'), node requests ('nr') and forwarded requests ('fr'). These types of information are exemplary, and not intended to be limiting. At least some of these types of information may be of different data widths than the others. Furthermore, some of these data types may typically have higher priorities than other types of data.

Arbitration multiplexers 222 in the embodiment shown are also associated with grant logic 455, which is coupled to receive various signals, such as the arb0 grants and arb1 grants from the arbitration unit 224. Grant logic 455 includes circuitry to generate additional grant signals that may be provided to various ones of multiplexers 450, as shown. Additionally, grant logic 455 may include circuitry coupled to remainder buffer 458 that is configured to monitor the amount of data stored therein, and may thus generate a remainder size ('Rem_size') signal based thereon. A high priority grant signal ('dq_gnt') may also be received by grant logic 455 for insertion of a high priority packet, as is discussed below.

Packet selection for logical frame formation is initially performed, in parallel, by two separate pipelines each having two separate stages. One of the multiplexers 450, in the first pipeline of the embodiment shown, is coupled to receive data, forwarded data, and programmed I/O inputs. A first multiplexer 450 in the top row is configured to select one of the inputs of data, forwarded data, and programmed I/O, based on received data_gnt and pio_gnt signals. The output of this multiplexers is 160 bits, or 20 bytes, which is the equivalent of the size of the logical frame to be generated. For this embodiment, the 20 bytes represents an upper limit on the size of the first packet to be selected, although packets that are less than this size may also be selected. The output from this multiplexer 450 is provided as an input to a next multiplexer 450, along with response data ('resp0_resp_1', which may be responses to system queries) and node requests/forwarded requests ('nr_fr') provided from the other pipeline (to be discussed). The second multiplexer 450 in this pipeline is coupled to receive the arb0 grants signals, and may thus select one of these input to be output as the first packet, packet 0, to the first packet register ('PKT0').

In the second pipeline, a pair of multiplexers 450 are coupled to receive various node requests and forwarded requests, and may select these based on node request/forwarded request grant signals ('nr_fr_a_gnts' and 'nr_fr_b_gnts'). The outputs from these multiplexers may be combined and stored in temporary register 451, which in turn provides an input to the second state multiplexer 450 in each of the pipelines. Another input to the second stage multiplexer 450 in the second pipeline is the output from the first stage multiplexer 450 in the first pipeline, in the form of data_pio, which is a concatenation of data and programmed I/O. A third input to this multiplexer 450 is resp0_data_pio, which is also a concatenation. The output from the second stage multiplexer 450 of the second pipeline is the second packet, pkt1, and is provided to the PKT1 register.

Each of the PKT0 and PKT1 registers may augment their respectively received outputs by 40 bits of logical zeros, and thus both are greater than the maximum logical frame size for this embodiment. A third stage multiplexer in may select, from the PKT1 register, whether the resulting information is forwarded with the extra logic 0's appended to the most significant or least significant bit positions, based on the received grant signals. The selection signal provided to the third stage multiplexer (i.e. the one coupled to the PKT1 register) arb0_resp_gnt_arb0_10B_gnt, is actually a concatenation of the signals from which its name is formed. In the output from the PKT0 register, the logic zeros are appended to the least significant bit positions. The addition of the added logic zeros in this embodiment allows for shifting of the selected packets that may be necessary in forming the final logical frame.

The output from the two pipelines may be bitwise logically ORed in OR gate 463. In some instances, when pkt0 consumes the entire logical frame, no second packet is granted, and thus the output of from the second pipeline will be all logic 0's.

In the embodiment shown, arbitration multiplexers 222 allow for the insertion of a high priority packet (i.e. a packet with high priority than any of the others previously selected) into the logical frame. Prior to this point, the logical frame is speculatively generated. In this particular embodiment, the higher priority packets is labeled as dq[39:0], and may be inserted into the pending logical frame by assertion of the dq_gnt signal. When asserted, the dq_gnt signal causes both the output of OR gate 463 and the high priority packet dq[39:0] to be passed through the correspondingly coupled multiplexer 450, with the high priority packet appended to the most significant bit positions. As such, the logical frame may be updated by insertion of the high priority packet. If the dq_gnt signal is not asserted, the speculatively generated logical frame passes through the corresponding multiplexer 450.

The output from the final multiplexer 450 is a 240 bit output, which is provided to shifter 453. The shifter 453 may shift the data in the output by an amount that depends on the remainder size, providing an output dq_dout[239:0] to a second OR gate 466. This output may or may not include an inserted high priority packet depending upon whether the dq_gnt signal was asserted. OR gate 466 may bitwise OR the output of shifter 453 with the remainder from remainder buffer 453. Thereafter, the output is provided to output register 457, which is a 240 bit register. The logical frame is output from this register, and is 160 bits wide, while any remainder is temporarily stored in remainder buffer 458. This data may be OR'd into subsequent outputs so that that any selected but unused packets (e.g., due to insertion of a high priority packet) may subsequently be forwarded. A mask unit 471 is also coupled between buffer 458 and second OR gate 466. The mask unit 471 is implemented since there may be unused data that was not granted in the remainder buffer. Some of these bits may be masked in a subsequent ORing operation. The actual bits that are masked, if any, may be determined by signals generated by grant logic 455.

The logic equations for the various grant signals in this particular embodiment are now shown in the ensuing paragraphs. The arb0 and arb1 grants may be implemented in arbiters 405 and 410 as discussed above, while grant logic 455 may implement the remainder of these equations based on the arb0 and arb1 grants along with the requests received from the various sources (i.e. from the functional circuit blocks in the IC).

data_pio_req=data_req | fdata_req | pio_req nr_fr_req=nr0_req | fr0_req nr_fr_a_gnts={nr0_req & (~fr0_prio | ~fr0_req), fr0_req & (fr_prio | ~nr0_req)} nr_fr_b_gnts={nr0_req & ~fr_prio & fr0_req, fr0_req & ft_prio & nr0_req & (rem_size<2) & ~data_pio_req, {resp0, data_pio[159:40]} fr1_req & ~nr0_req & ~data_pio_req & ~resp0_req} nr1_req & ~fr0_req & ~data_pio_req & ~resp0_req} data_pio_gnts={data_req & (~fdata_prio&~pio_prio | ~fdata_req&~pio_req | pio_prio&~pio_req), fdata_req & (fdata_prio | ~pio_req&~data_req |~pio_prio&~data_req), pio_req & (pio_prio | ~data_req&~fdata req | fdata_prio&~fdata_req)} arb0_gnts={resp0_req & (resp_prio| ~data_pio_req&~nr_fr_req | nr_fr_prio&~nr_fr_req), data_pio_req & (data_pio_prio | ~nr_fr_req&~resp0_req |resp_prio&~resp0_req), nr_fr_req & (nr_fr_prio | ~resp0_req&~data_pio_req |data_pio_prio&~data_pio_req)} arb1_gnts={resp0_req & (nr_fr_prio & nr_fr_req | data_pio_prio & (data_pio_req ^ nr_fr_req)), data_pio_req & (resp_prio & resp0_req | nr_fr_prio & (nr_fr_req^resp0_req)), nr_fr_req & (data_pio_prio & data_pio_req | resp_prio & (resp0 req^data_pio_req))} arb0_10B_gnt=arb0 nr_gnt & ~fr0_req | arb0_fr_gnt & (~nr0_req | data_pio_req | rem_size>1)

dq_gnt=dq_req resp1=resp1_req & ~data_pio_req & ~nr_fr_req

Figure 5:
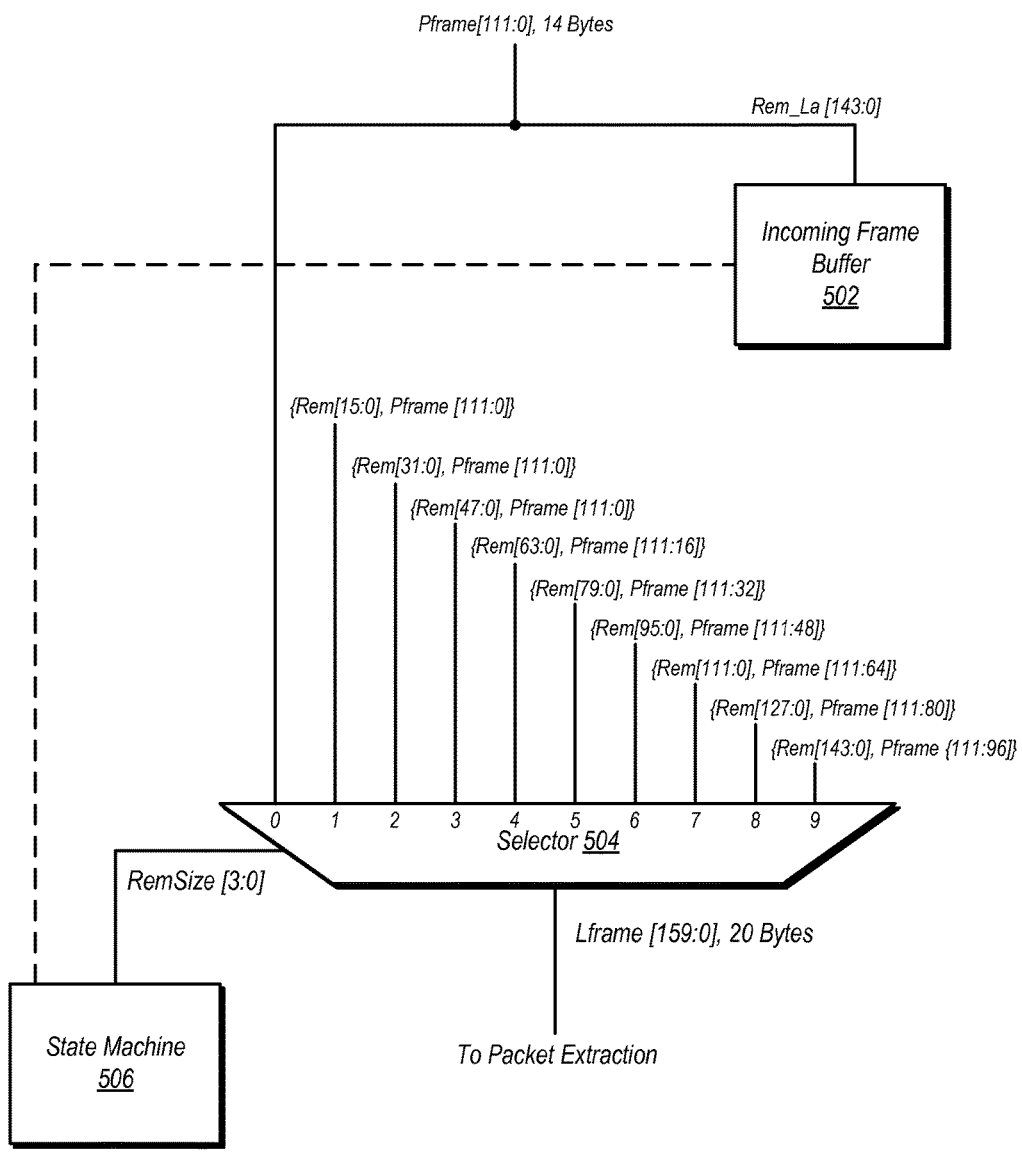
FIG. 5 is a diagram of one embodiment of circuitry in the framing unit for converting physical frames to logical frames.

FIG. 5 is a diagram of one embodiment of circuitry in the framing unit for converting physical frames to logical frames. Where the embodiment of L2P 218 discussed above is configured to convert logical frames of up to 20 bytes to physical frames of 14 bytes, P2L 214 in the embodiment shown is configured to 14 byte physical frames into logical frames of up to 20 bytes.

P2L 214 in the embodiment shown includes incoming frame buffer 502. Each incoming physical frame may be stored in the incoming frame buffer 502, even in instances when a portion of that frame will be used to form the logical frame. State machine 506 includes circuitry configured to determine the amount of data stored in incoming frame buffer 502. If the amount of data in incoming frame buffer 502 is equal to or greater than the logical frame size, selection signals may be generated to cause selector 504 to select the data to form the logical frame. Each logical frame output from P2L 214 may be formed using a portion of the incoming physical frame and apportion of the data stored in incoming frame buffer 502. The circuitry in state machine 506 may determine which portions of the incoming physical frame and data from the incoming frame buffer 502 are used to form the outgoing logical frame. For example, if state machine 506 causes position 9 of selector 504 to be selected, bits 111:96 (2 bytes) of the incoming physical frame and bits 143:0 (18 bytes) in the incoming frame buffer are selected and combined to form a 20 byte logical frame that is output to packet extraction circuitry.

While the embodiments of the various units above have been implemented using physical electronic circuitry, embodiments that are also implemented at least in part using software are also possible and contemplated.

Figure 6:
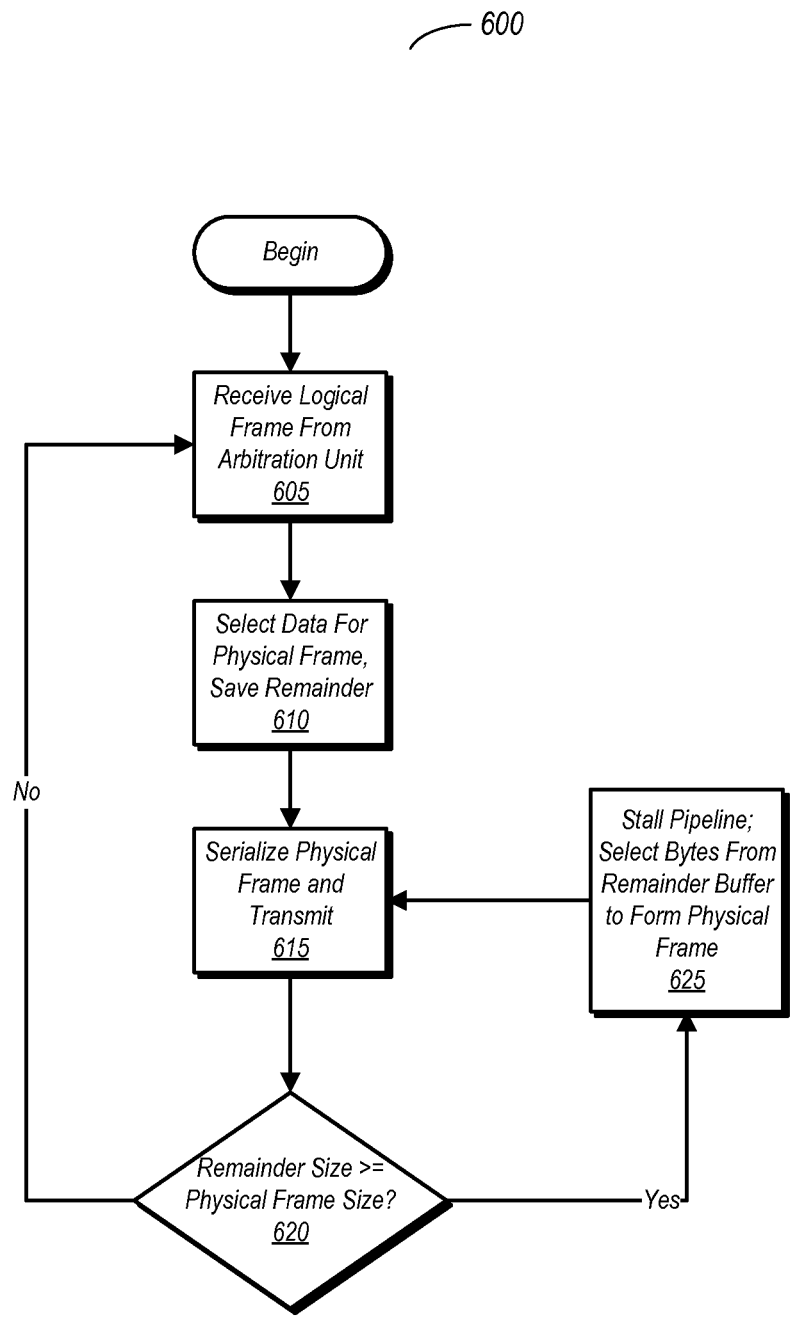
FIG. 6 is a flow diagram illustrating one embodiment of a method for converting logical frames to physical frames.

Turning now to FIG. 6, a flow diagram illustrating one embodiment of a method for converting logical frames to physical frames is shown. Method 600 as discussed herein may be performed by any embodiment of the circuitry discussed above. Furthermore, embodiments of circuitry and/or software not explicitly discussed herein may also perform method 600.

Method 600 begins with the receiving of a logical frame from an arbitration unit (block 605). The logical frame in this embodiment may be larger than physical frame that is to be formed. After receiving the logical frame, the data for the physical frame may be selected (block 610). At least some of the data for the physical frame may be selected from the received logical frame. In some instances, all of the data used for the physical frame may be taken from the received logical frame. In other instances, some of the data may be taken from the remainder buffer, with the rest of the data being taken from the logical frame.

The resulting physical frame may be conveyed through the pipeline to a SERDES, where it may be serialized and transmitted (block 615). Prior to the formation of the next physical frame, a check is made to determine if the amount of data stored in remainder buffer is equal to or greater than the size of a physical frame (block 620). If the amount of data stored in the remainder buffer is less than the physical frame size (block 620, no), then the next logical frame is received and provides at least some data for the next physical frame to be formed. However, if the amount of data in the remainder buffer is equal to or greater than the physical frame size (block 620, yes), then the pipeline is stalled and the next physical frame is formed based solely on data in the remainder buffer (block 625). Method 600 then proceeds back to block 615, as the newly formed frame is serialized and transmitted. The method then proceeds to block 620 again.

Figure 7:
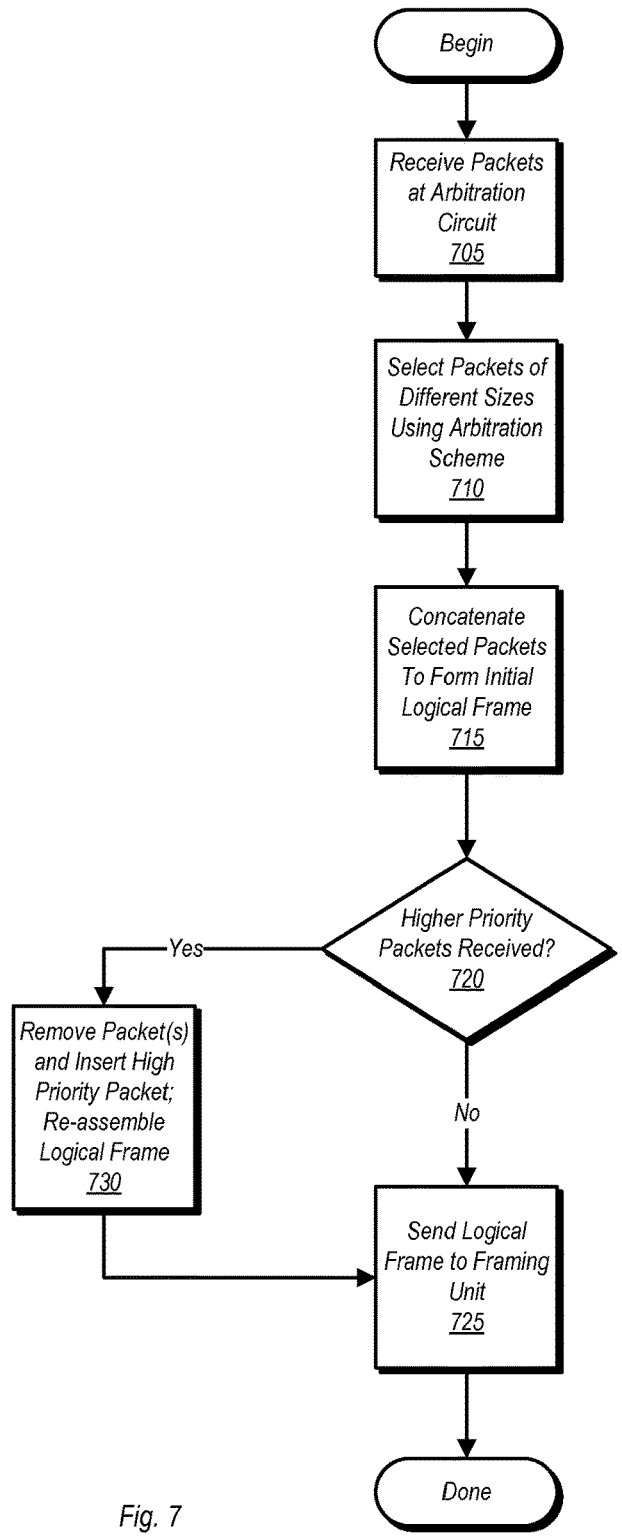
FIG. 7 is a flow diagram illustrating one embodiment of a method for forming logical frames using an arbiter selecting among a number of packets.

FIG. 7 is a flow diagram illustrating one embodiment of a method for forming logical frames using an arbiter selecting among a number of packets. Method 700 as discussed herein may be performed by any embodiment of the circuitry discussed above. Furthermore, embodiments of circuitry and/or software not explicitly discussed herein may also perform method 700.

Method 700 begins with the receiving of various packets at an arbitration circuit (block 705). The packets may be received from various functional circuit blocks in the IC in which the arbitration circuit is implemented. After the packets have been received, the arbitration circuit may select packets of different sizes using an arbitration scheme (block 710). The selection of packets to form the logical frame may be based on a segment size, as discussed above, with the logical frame size being an integer multiple of the segment size. After the packets have been selected, the initial logical frame may be formed by concatenating the packets together (block 715). In one embodiment, a register having an equivalent size to the logical frame may receive the various packets and may thus temporarily store the initially formed logical frame.

After formation of the initial logical frame, a determination may be made as to whether any higher priority packets have been received subsequent to initially receiving the packets (block 720). If no higher priority packets have been received (block 720, no), then the initially formed logical frame may be conveyed to a framing unit for conversion into physical frames (block 725). If a higher priority packet has been received (block 720, yes), then the logical frame may be re-formed (block 730). In particular, the higher priority packet may be inserted into the frame, with one or more other packets being discarded. The logical frame may be re-assembled such that there are no unused spaces. Thereafter, the reassembled logical frame may be conveyed to the framing unit to form a basis for one or more physical frames (block 725).

Figure 8:
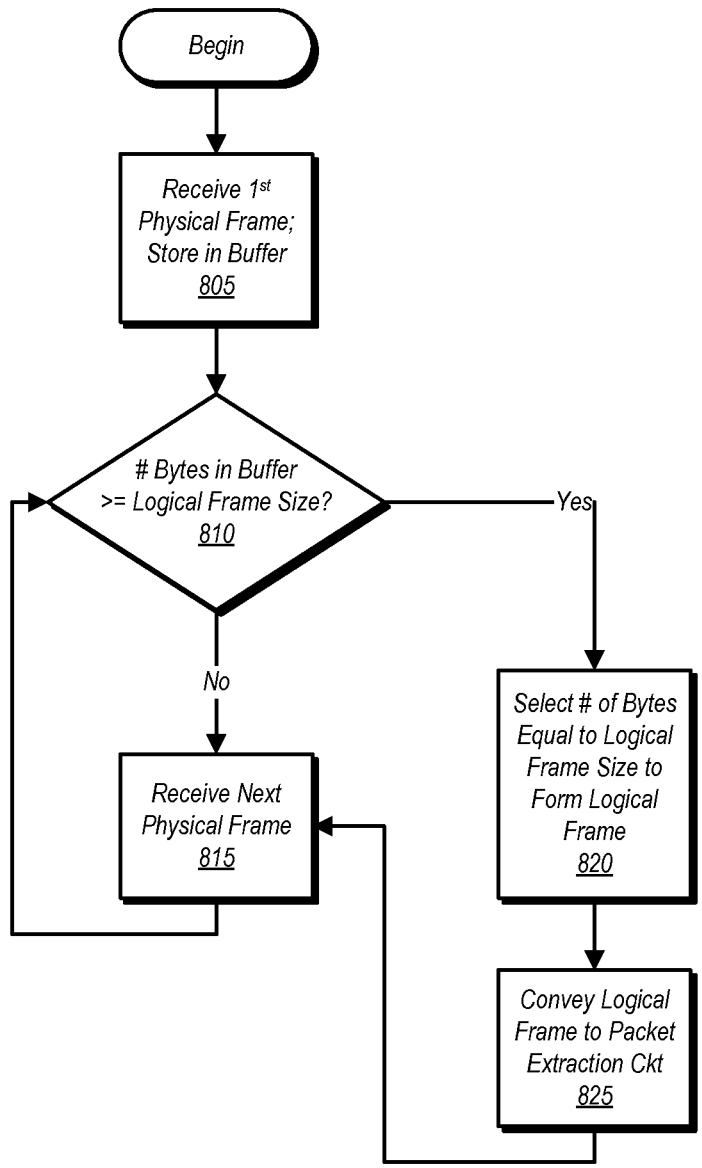
FIG. 8 is a flow diagram illustrating one embodiment of a method for converting physical frames to logical frames.

FIG. 8 is a flow diagram illustrating one embodiment of a method for converting physical frames to logical frames. Method 800 as discussed herein may be performed by any embodiment of the circuitry discussed above. Furthermore, embodiments of circuitry and/or software not explicitly discussed herein may also perform method 800.

Method 800 begins with the receiving of a first physical frame and storing it in a buffer (block 805). Upon receiving the physical frame, a check is made to determine if the amount of data stored in the buffer is greater than or equal to the logical frame size (block 810). If the amount of data stored in the buffer is less than the logical frame (block 810, no), the next physical frame may be received without prior to the formation of a logical frame (block 815). The method may then return to block 810. If the amount of data stored in the buffer is greater than or equal to the logical frame size (block 810, yes), an amount of data equal to the logical frame size may be selected from the buffer to form a logical frame (block 820). The logical frame may then be conveyed to a packet extraction circuit (block 825). Thereafter, the method received to block 815, at which the next physical frame is received.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
   a serializer-deserializer (SERDES) coupled to a communications link and configured to convert outgoing data transmissions from parallel to serial and convert incoming data transmissions from serial to parallel; and
   a framing unit coupled to the SERDES and comprising circuitry configured to convert data between a logical frame format for parallel transfer and a physical frame format for serial transfer over the communications link, wherein a logical frame has a first number of bytes and the a physical frame has a second number of bytes that is less than or equal to the first number, wherein the first number is variable and the second number is fixed;
   wherein the framing unit is further configured to convert data between the logical frame format and the physical frame format when the first number is a non-integral power of two; and
   wherein the framing unit is configured to generate the physical frame, and further configured to responsive to receiving a high priority packet insert the high priority packet into the physical frame by appending the high priority packet into a most significant set of bit positions of the physical frame.

2. The integrated circuit as recited in claim 1, wherein the framing unit is coupled to receive a logical frame for an outgoing transmission, wherein the first number of bytes is greater than the second number of bytes, and wherein the framing unit is configured to use a subset of the first number of bytes to produce the physical frame and store remaining ones of the first number of bytes in a buffer.

3. The integrated circuit as recited in claim 2, wherein the framing unit is configured to determine a third number of bytes stored in the buffer and further configured to, responsive to determining that the third number of bytes is greater than or equal to the second number of bytes, assemble a subsequent physical frame using at least a subset of the third number of bytes.

4. The integrated circuit as recited in claim 1, wherein the first number of bytes are transferred in parallel over a plurality of lanes, wherein each of the plurality of lanes is configured to convey at least one byte.

5. The integrated circuit as recited in claim 4, wherein at least one lane is configured to convey information including a cyclic redundancy check (CRC) code.

6. The integrated circuit as recited in claim 4, wherein the framing unit is configured to determine if a given one of the plurality of lanes is defective and further configured to, responsive to determining that the given one of the plurality of lanes is defective, perform conversion of data between logical frames and physical frames utilizing remaining ones of the plurality of lanes that are not defective.

7. The integrated circuit as recited in claim 1, wherein the framing unit is configured to receive a first physical frame of a first incoming transaction, wherein the framing unit includes a buffer configured to provide temporary storage of data of the physical frame.

8. The integrated circuit as recited in claim 7, wherein if the first number is greater than the second number, the framing unit is configured to store data of a second incoming transaction subsequent to the first incoming transaction, and wherein responsive to determining that an amount of data stored in the buffer exceeds the first number of bytes, the framing unit is configured to select a number of bytes equal to the first number for conversion to an incoming logical frame.

9. The integrated circuit as recited in claim 1, wherein the logical frame comprises a plurality of packets concatenated together, wherein at least one of the plurality of packets has a different size than one or more other ones of the plurality of packet.

10. The integrated circuit as recited in claim 1, wherein the first number is a non-integer value.

11. A method comprising:
    converting, using a framing circuit, data between a logical frame format for parallel transfer and a physical frame format to be serialized for serial data transfer over a serial communications link, wherein a logical frame has a first number of bytes and a physical frame has a second number of bytes that is less than or equal to the first number of bytes, wherein the first number is variable and the second number is fixed, and wherein at least one possible value of the first number is a non-integral power of two, wherein converting a logical frame into a physical frame includes generating the physical frame, and subsequent to generating and responsive to receiving a high priority packet, inserting the high priority packet into the physical frame by appending the high priority packet into a most significant set of bit positions of the physical frame serializing a first physical frame, using a serializer-deserializer (SERDES) for transmission over the serial communications link; and de-serializing a second physical frame, using the SERDES, received over the serial communications link.

12. The method as recited in claim 11, further comprising:
    receiving, at the framing circuit, a first logical frame for a first outgoing transmission, wherein the first number of bytes is greater than the second number of bytes;
    forming a first physical frame using a subset of the first number of bytes of the first logical frame;
    saving a first remainder of the first number of bytes in a buffer;
    forming one or more additional physical frames from one or more additional logical frames;
    saving one or more additional remainders in the buffer; and
    responsive to determining that an amount of data stored in the buffer is greater than or equal the second number of bytes, forming a second physical frame from the data stored in the buffer.

13. The method as recited in claim 11, further comprising:
    transferring the first number of bytes in parallel over a plurality of lanes, wherein at least one of the plurality of lanes conveys a cyclic redundancy check (CRC) code;
    determining if one or more of the plurality of lanes is defective using the CRC code;
    responsive to determining that at least one of the plurality of lanes is defective, performing conversion of data between logical and physical frames utilizing ones of the plurality of lanes that are not defective.

14. The method as recited in claim 11, further comprising:
    receiving a first physical frame of an incoming transaction, wherein the first physical frame includes the second number of bytes, and wherein the second number is less than the first number of bytes;

storing the first physical frame in a buffer;

receiving one or more additional physical frames in corresponding incoming transactions; and responsive to determining an amount of data stored in the buffer is equal to or greater than the first number of bytes, selecting a number of bytes equal to the first number for conversion to an incoming logical frame.

15. The method as recited in claim 11, further comprising concatenating a number of packets together to form the logical frame.

16. A system comprising:
a first integrated circuit (IC); a second IC coupled to the first IC; and
a serial communications link coupled between the first IC and the second IC; wherein each of the first and second ICs include:
a serializer-deserializer (SERDES) coupled to the communications link and configured to convert outgoing data transmissions from parallel to serial and convert incoming data transmissions from serial to parallel; and
a framing circuit coupled to the SERDES and configured to convert data between a logical frame format for parallel transfer and a physical frame format for serial transfer over the communications link, wherein a logical frame has a first number of bytes and a physical frame has a second number of bytes that is less than or equal to the first number, wherein the first number is variable and the second number is fixed; wherein the framing circuit is further configured to convert data between the logical frame format and the physical frame format when the first number is a non-integral power of two; and wherein the framing circuit is configured to generate the physical frame, and further configured to responsive to receiving a high priority packet, insert the high priority packet into the physical frame by appending the high priority packet into a most significant set of bit positions of the physical frame.

17. The system as recited in claim 16, wherein the framing circuit of each of the first IC and the second IC is coupled to receive a logical frame for an outgoing transmission, wherein the first number of bytes is greater than the second number of bytes, and further configured to use a subset of the first number of bytes to produce the physical frame and store remaining ones of the first number of bytes in a buffer.

18. The system as recited in claim 17, wherein the framing circuit of each of the first IC and second IC is configured to determine a third number of bytes stored in the buffer and further configured to, responsive to determining that the third number of bytes is greater than or equal to the second number of bytes, assemble a subsequent physical frame using at least a subset of the third number of bytes.

19. The system as recited in claim 16, wherein the first number of bytes are transferred in parallel over a plurality of lanes, wherein each of the plurality of lanes if configured to convey at least one byte, and wherein at least one lane is configured to convey information including a cyclic redundancy check (CRC) code.

20. The system as recited in claim 16, wherein the framing circuit of each of the first IC and the second IC is configured to determine if a given one of the plurality of lanes is defective and further configured to, responsive to determining that the given one of the plurality of lanes is defective, perform conversion of data between logical frames and physical frames utilizing remaining ones of the plurality of lanes that are not defective.

* * * * *

UNITED STATES PATENT AND TRADEMARK OFFICE
CERTIFICATE OF CORRECTION

PATENT NO. : 10,033,838 B2
APPLICATION NO. : 14/872716
DATED : July 24, 2018
INVENTOR(S) : Parkin It is certified that error appears in the above-identified patent and that said Letters Patent is hereby corrected as shown below:

In the Specification

In Column 10, Line 30, delete "that that" and insert -- that --, therefor.

In Column 10, Line 53, delete "ft_prio" and insert -- fr_prio --, therefor.

In the Claims

In Column 13, Line 20, in Claim 1, delete "the a" and insert -- a --, therefor.

In Column 14, Line 51, in Claim 12, after "equal" insert -- to --.

In Column 16, Line 22, in Claim 19, delete "if" and insert -- is --, therefor.

Signed and Sealed this
Fourteenth Day of May, 2019

Andrei Iancu
*Director of the United States Patent and Trademark Office*